United States Patent [19]

Ohkura

[11] Patent Number: 4,847,857
[45] Date of Patent: Jul. 11, 1989

[54] SINGLE WAVELENGTH SEMICONDUCTOR LASER

[75] Inventor: Yuji Ohkura, Itami, Japan

[73] Assignee: Mitsubishi Denki Kabushiki Kaisha, Japan

[21] Appl. No.: 216,021

[22] Filed: Jul. 7, 1988

[30] Foreign Application Priority Data

Jul. 8, 1987 [JP] Japan .................. 62-170764

[51] Int. Cl.⁴ .................................. H01S 3/19
[52] U.S. Cl. ............................ 372/96; 372/32
[58] Field of Search ............ 372/96, 32, 43, 44

[56] References Cited

U.S. PATENT DOCUMENTS 4,665,528  5/1987  Chinone et al. ............... 372/96

OTHER PUBLICATIONS

Yamaguchi et al., "Phase Shifted DFB-DC-PBH LD in 1.55 Micrometer Wavelength Range", Japanese Electronics Information and Communication Association, No. OQE-150, pp. 33-38.

Soda et al., "Stability in Single Longitudinal Mode Operation in GaInAsP/Inp Phase Adjusted DFB LDs", Tenth IEEE International Semiconductor Laser Conference, E-2, pp. 60-61, Oct. 1986.

Primary Examiner—James W. Davie
Attorney, Agent, or Firm—Leydig, Voit & Mayer

[57] ABSTRACT

In a single wavelength oscillation semiconductor laser having a diffraction grating at the active region, the coupling coefficient between the light and the diffraction grating is low within the laser and high in the neighborhood of the resonator end surface. The amplitude of the diffraction grating is low within the laser and high in the neighborhood of the resonator end surface, or the active layer or the guide layer is thick within the laser and thin in the neighborhood of the resonator end surface. Thus, the laser oscillates at a single wavelength even at high power output operation.

5 Claims, 2 Drawing Sheets

SINGLE WAVELENGTH SEMICONDUCTOR LASER

FIELD OF THE INVENTION

The present invention relates to a semiconductor laser, and more particularly to a laser capable of oscillating at a single wavelength even at a high power output operation.

BACKGROUND OF THE INVENTION

FIG. 5 shows a cross section of a prior art single wavelength oscillation semiconductor laser as disclosed in "Optics," Vo.15, No. 2, pp. 115 to 121. In FIG. 5, the reference numeral 1 designates an n type InP substrate. A diffraction grating 20 having a phase shift region 21 at the central portion is disposed at the surface of the substrate 1. A guide layer 3 comprising InGaAsP is disposed on the substrate 1 having the diffraction grating 20. An InGaAsP active layer 4 is produced on the guide layer 3 and a p type InP substrate 5 is produced on the active layer 4. Electrode metals 7 are provided at the upper and the lower surfaces of the substrates 5 and 1, respectively, and non-reflection coating films 8 are provided at the both side surfaces of the laser.

The device will be operated as follows.

In this semiconductor laser, electrons in the n type InP substrate 1 and holes in the p type InP substrate 5 are both injected into the InGaAsP active layer 4 and produce light emitting recombinations therein. In the distributed feedback (DFB) laser having a diffraction grating at the active region, light generated by the recombinations is reflected by the diffraction grating 20 and reverberates inside the element, thereby achieving laser oscillation. Then, since a phase shift region 21 is provided at the central portion of the diffraction grating 20, the oscillation wavelength becomes a single wavelength called the Bragg wavelength which is determined by the pitch of the diffraction grating 20.

The proportion of the light generated at the active region that is reflected by the diffraction lattice 20 increases as the coupling coefficient κ between the light and diffraction grating 20 increases. When the coupling coefficient κ is high, the proportion of the light which is confined inside the element by diffraction grating 20 is large, and the laser oscillates at a low threshold current. At the high output operation, however, the light density at the central portion of the element begins too high, and the laser becomes to oscillate at multiple wavelengths, causing localized hole burning. To the contrary, when the coupling coefficient κ is low, the single wavelength property is weakened and the threshold current is increased. Accordingly, it is undesirable to achieve high power output by lowering the coupling coefficient.

Thus, in the prior art single wavelength oscillation semiconductor laser, the light density at the central portion of the laser becomes too high at high power output operation, thereby causing oscillation at multiple wavelengths.

SUMMARY OF THE INVENTION

An object of the present invention is to provide a single wavelength oscillation semiconductor laser capable of oscillating at a single wavelength even at high power output operation.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In a single wavelength oscillation semiconductor laser according to the present invention, the coupling coefficient between the light and diffraction grating is lowered at the element central portion and is increased in the neighborhood of the resonator end surface. Accordingly, the light density at the element central portion does not become too high even at the high power output operation, and the laser oscillates at a single wavelength.

DETAILED DESCRIPTION OF THE PREFERRED EMBODIMENTS

An embodiment of the present invention will be described in detail with reference to the drawings.

Figure 1:
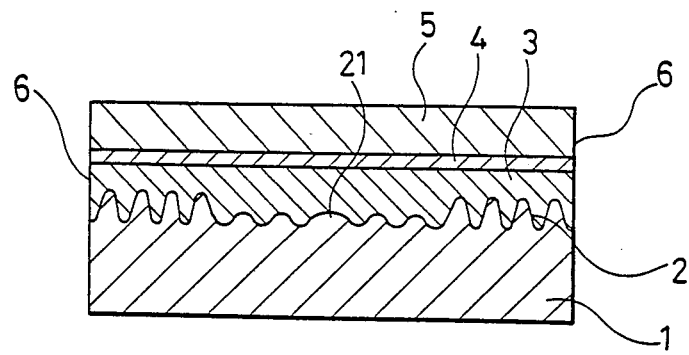
FIG. 1 is a cross-sectional view showing a single wavelength oscillation semiconductor laser as an embodiment of the present invention.

FIG. 1 shows a cross-sectional view of a single wavelength oscillation semiconductor laser as an embodiment of the present invention. In FIG. 1, the reference numeral 1 designates an n type InP substrate. A diffraction grating 2 having a phase shift region 21 at the central portion thereof is disposed at the surface of the substrate 1. The height of the diffraction grating 2 at the element central portion is made lower than the height thereof in the neighborhood of the resonator end surface. A guide layer 3 comprising InGaAsP is disposed on the substrate 1 having the diffraction grating 2. An InGaAsP active layer 4 is disposed on the guide layer 3 and a p type InP layer 5 is disposed on the active layer 4.

The production method of this embodiment will be described with reference to FIGS. 2(a, 2(b) and 2(c).

Figure 2A:
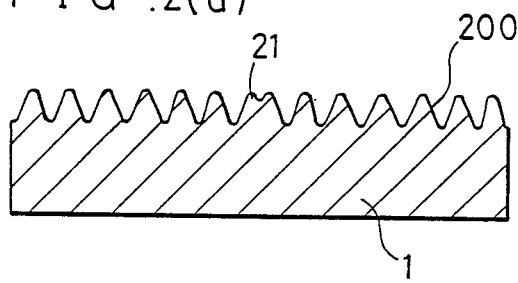
FIGS. 2(a), 2(b) and 2(c) are are diagrams showing a method of producing the device of FIG. 1.
Figure 2B:
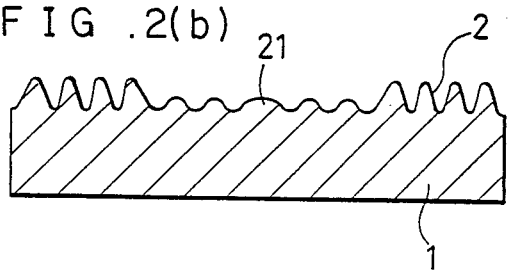
Figure 2C:
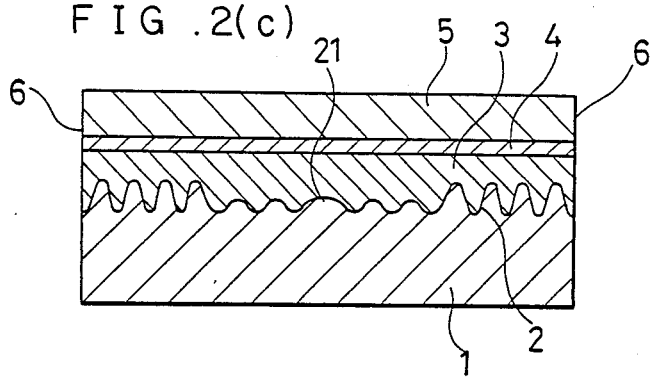

A diffraction grating 200 of uniform height and having a phase shift region 21 is produced at the surface of the n type InP substrate 1 as shown in FIG. 2(a), and thereafter, the height of the diffraction grating 200 at the central portion is lowered by etching to produce a diffraction grating 2 as shown in FIG. 2(b). Thereafter, the InGaAsP guide layer 3, the InGaAsP active layer 4, and the p type InP layer 5 are produced by the same method as in the prior art as shown in FIG. 2(c).

The device will be operated as follows.

When the height of the diffraction grating 2 at the active region is low, the amplitude of the periodic variation of the equivalent refractive index of the guide layer 3 having the diffraction grating 2 in the resonator length direction is small. Since the light is reflected in an amount which is determined in accordance with the amplitude of the variation of the refractive index, if the amplitude of the periodic variation is small, the reflection is small. That is, the coupling coefficient between the light and diffraction lattice is low. Accordingly, when the height of the diffraction lattice 2 at the central portion is made lower than that in the neighborhood of the resonator end surface, a state in which the coupling coefficient κ at the element central portion is lower than that in the neighborhood of the resonator end surface is realized. In this case, a large amount of the light generated in the active layer 4 proceeds to the neighborhood of the resonator end surface and is reflected by the diffraction grating thereat without all the light being confined only within the element central portion. Accordingly, the light density is not increased only at the central portion, and a light density uniform over the entire element is obtained. Therefore, the light density may not be proportionally increased and the laser does not oscillate at multiple wavelengths.

In the above-illustrated embodiment, the coupling coefficient between the light and diffraction grating is made lower at the element central portion than that in the neighborhood of the resonator end surface 6 by making the height of the diffraction lattice 2 at the element central portion lower than that in the neighborhood of the resonator end surface. However, this result can also be achieved by increasing the thickness of the active layer or the guide layer at the element central portion relative to its thickness at the resonator end surface to produce the same effect.

Figure 3:
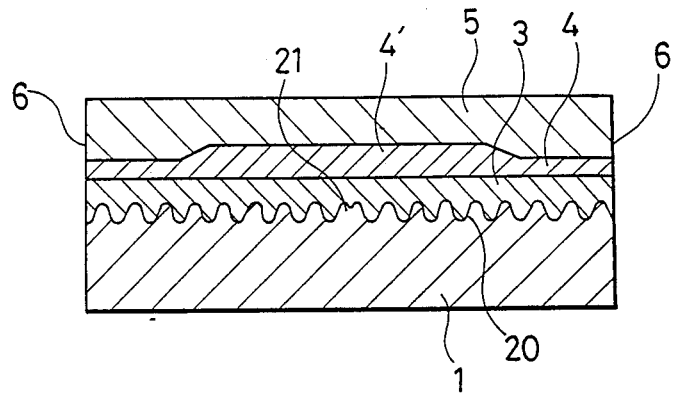
FIG. 3 is a diagram showing a second embodiment of the present invention.
Figure 4:
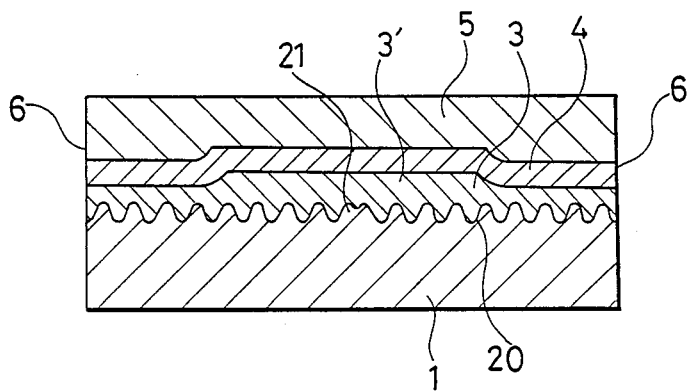
FIG. 4 is a diagram showing a third embodiment of the present invention.
Figure 5:
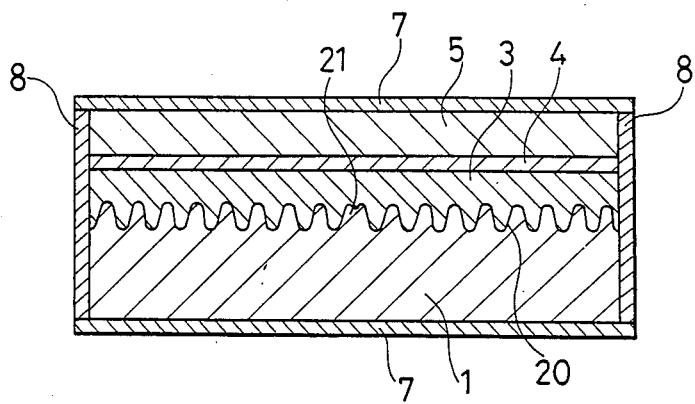
FIG. 5 is a diagram showing a prior art single wavelength oscillation semiconductor laser.

FIG. 3 shows a second embodiment of the present invention in which the active layer 4 is made thicker at the element central portion as shown by 4'. FIG. 4 shows a third embodiment of the present invention in which the guide layer 3 is made thicker at the element central portion as shown by 3' in a similar manner. In this latter case, the light density at the guide layer 3' in the element central portion decreases and the above described coupling coefficient is lowered.

In the above illustrated embodiments, the coupling coefficient between the light and diffraction grating is made low or high discontinuously, but may be changed continuously.

As is evident from the foregoing description, in a single wavelength oscillation semiconductor laser according to the present invention, the coupling coefficient between the light and diffraction grating is lowered at the element central portion and raised in the neighborhood of the resonator end surface. Accordingly, a single wavelength oscillation semiconductor laser which oscillates at a single wavelength, even at high power output operation, is obtained.

What is claimed is:

1. A semiconductor laser for generating light at a single wavelength comprising opposed resonator end surfaces and a plurality of semiconductor layers extending between said end surfaces including a layer of a first conductivity type, a guide layer disposed on said layer of a first conductivity type, and an active region disposed on said guide layer opposite said layer of a first conductivity type wherein a diffraction grating is formed at the interface of said layer of a first conductivity type and said guide layer by complementary periodic variations in the thicknesses of said layer of a first conductivity type and said guide layer, and the amplitude of said periodic variations is relatively low at a portion of said laser centrally disposed between said end surfaces and relatively high adjacent said end surfaces.

2. The semiconductor laser of claim 1 wherein said diffraction grating includes a phase shift region centrally disposed between said end surfaces.

3. The semiconductor laser of claim 1 wherein said periodic variations have substantially the same period in said central portion and adjacent said end surfaces.

4. A semiconductor laser for generating light at a single wavelength comprising opposed resonator end surfaces and a plurality of semiconductor layers extending between said end surfaces including a layer of a first conductivity type, a guide layer disposed on said layer of a first conductivity type, an active region disposed on said guide layer opposite said layer of a first conductivity type, and a diffraction grating formed at the interface of said layer of a first conductivity type and said guide layer by complementary periodic variations in the thicknesses of said layer of a first conductivity type and said guide layer, said diffraction grating including a phase shift region centrally disposed between said end surfaces wherein one of said active and guide layers is relatively thick at a portion of said laser centrally disposed between said end surfaces and relatively thin adjacent said end surfaces.

5. The semiconductor laser of claim 4 wherein said periodic variations have substantially the same period in said central portion and adjacent said end surfaces.

* * * * *